United States Patent [19]

Kitagawa

[11] 4,050,061
[45] Sept. 20, 1977

[54] PARTITIONING OF MOS RANDOM ACCESS MEMORY ARRAY

[75] Inventor: Norihisa Kitagawa, Houston, Tex.

[73] Assignee: Texas Instruments Incorporated, Dallas, Tex.

[21] Appl. No.: 682,685

[22] Filed: May 3, 1976

[51] Int. Cl.² .......................... G11C 7/06; G11C 8/00
[52] U.S. Cl. .......................... 340/173 R; 340/173 DR; 340/173 FF; 340/173 CA
[58] Field of Search ..... 340/173 R, 173 CA, 173 FF, 340/173 DR

[56] References Cited
U.S. PATENT DOCUMENTS

| 3,678,473 | 7/1972 | Wahlstrom | 340/173 CA |
| 3,771,147 | 11/1973 | Boll et al. | 340/173 CA |
| 3,806,898 | 4/1974 | Askin | 340/173 CA |

Primary Examiner—Stuart N. Hecker
Attorney, Agent, or Firm—Harold Levine; Rene' E. Grossman; John G. Graham

[57] ABSTRACT

A random access memory device of the MOS integrated circuit type using an array of one-transistor storage cells employs bistable sense amplifier circuits, one located in the center of each column line. The bistable circuits have current-limiting control devices in series therewith and the control devices are selected by the address circuits in a manner such that during an initial sensing period the current is low, then during a later period more current may be permitted for a higher level output. In parts of the array which are not being accessed by the current address, the increased current level is not permitted, thus reducing power dissipation.

10 Claims, 6 Drawing Figures

PARTITIONING OF MOS RANDOM ACCESS MEMORY ARRAY

BACKGROUND OF THE INVENTION

This invention relates to semiconductor memory devices, and more particularly to a system for partitioning a high-density N-channel MOS memory device of the type employing an array of one-transistor memory cells.

MOS random access memory (RAM) devices are widely used in the manufacture of digital equipment, particularly minicomputers. The capabilities and cost advantages of these devices have increased steadily over the past few years. The cost per bit of storage using MOS RAMs goes down as the number of bits or memory cells per package goes up. At various times, successively larger RAM's have become standards in the industry, such as 256 bit, 512 bit, 1024 bit, and now 4096 bit. A RAM containing 4096 bits, for exaple is shown in U.S. Pat. No. 3,940,747 issued Feb. 24, 1976 to Kuo and Kitagawa, assigned to Texas Instruments. At the present time, manufacturers of semiconductor devices are attempting to produce 16,384 bit or 16K RAM's; see *Electronics*, Feb. 19, 1976, pp. 116-121.

As the number of bits in a semiconductor chip is increased, the cell size decreases, and the magnitude of the storage capacitor in each cell of necessity decreases. Also, the number of cells on a digit line in the array of cells increases, so the capacitance of this line increases. These factors reduced the magnitude of the data signal which exists on a digit line. A full logic level, i.e., the difference between a 1 and a 0, in one of these devices may be perhaps 10 or 12 volts; however, the difference in voltage between a 1 and a 0 for the data coupled to a digit line in the memory array from the selected one-transistor cell may be only one or two tenths of a volt. In a high density memory design, a sense amplifier circuit to detect these low-level signals is a critical element. Examples of sense amplifiers are shown in U.S. Pat. No. 3,940,747 mentioned above, and in U.S. Pat. No. 3,838,404 to Heeren, as well as in *Electronics*, Sept. 13, 1973, Vol. 46, No. 19, pp. 116-121, and *IEEE Journal of Solid State Circuits*, October, 1972, p. 336, by Stein et al.

In memory devices requiring high packing density, such as in the 16K RAM, the power dissipation becomes a critical factor, and the systems previously proposed have shortcomings in this regard.

It is the principal object of this invention to provide an improved system for partitioning the memory cell array and sense amplifier arrangement for an MOS RAM, and in particular system which is of low power dissipation.

The smallest proven sense amplifier circuits, even though advantageous to save space on the chip since so many are needed, are not acceptable due to high power dissipation. Although power reduction can be achieved by selectively turning off the load transistors in the flip-flop circuit of a typical sense amplifier, this method imposes restrictions which are disadvantageous. Read/modify/write and paging mode operations will be inhibited unless the center decode approach is used, at the cost of large chip size and reduced sensitivity. Also, the refreshing operation will be very poor due to the lack of a current supply in the addressed column.

Another recently developed sense amplifier has low power dissipation; however, it has the drawbacks of high instantaneous current, relatively poor sensitivity, and complex clock timing, and further requires a costly center decode layout to achieve paging mode and read/modify/write operation.

SUMMARY OF THE INVENTION

In accordance with this invention, a partitioning scheme to provide low power dissipation uses a sense amplifier as claimed in copending application Ser. No. 682,687. The memory array is partitioned into eight sensing blocks, each of which contains two equal arrays separated by a set of sense amplifiers. Each sensing block is selectively driven by clock signals derived from decoded addresses. At the beginning of the sensing cycle, four of the eight sensing blocks are turned on by clock voltages; this refreshes 128 bits at one cycle. In the sense amplifier, current is limited during this time, so power dissipation is low; the time period of this operation can be short because the 1 level on the digit line which goes high does not decay as in conventional sense amplifiers. For a refresh cycle, all of the load transistors in the sense amplifiers are turned off, and another current path to ground is turned on for the driver transistors in the sense amplifiers; this produces a good 0 level on the digit line which is to stay low. When the digit line is connected to the large precharged I/0 line capacitor by the column selector, a 1 voltage level on the opposite side of the sense amplifier would tend to decrease due to the high transient voltage on the digit line; were it not for the system of the invention, a stored 1 voltage could be thus reduced to a poor level or could fail. In this invention, the selected block (where the column select gate is on) turns on or remains on when the column address strobe comes in. A further current path for the driver transistors is turned on at this time, so that a good 0 level is assured, even though the load transistors for the flip-flop are on to maintain a good 1 level. This organization makes considerable power reduction possible while maintaining reliable sensing capability.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjuction with the accompanying drawings, wherein:

DETAILED DESCRIPTION OF SPECIFIC EMBODIMENT

Figure 1:
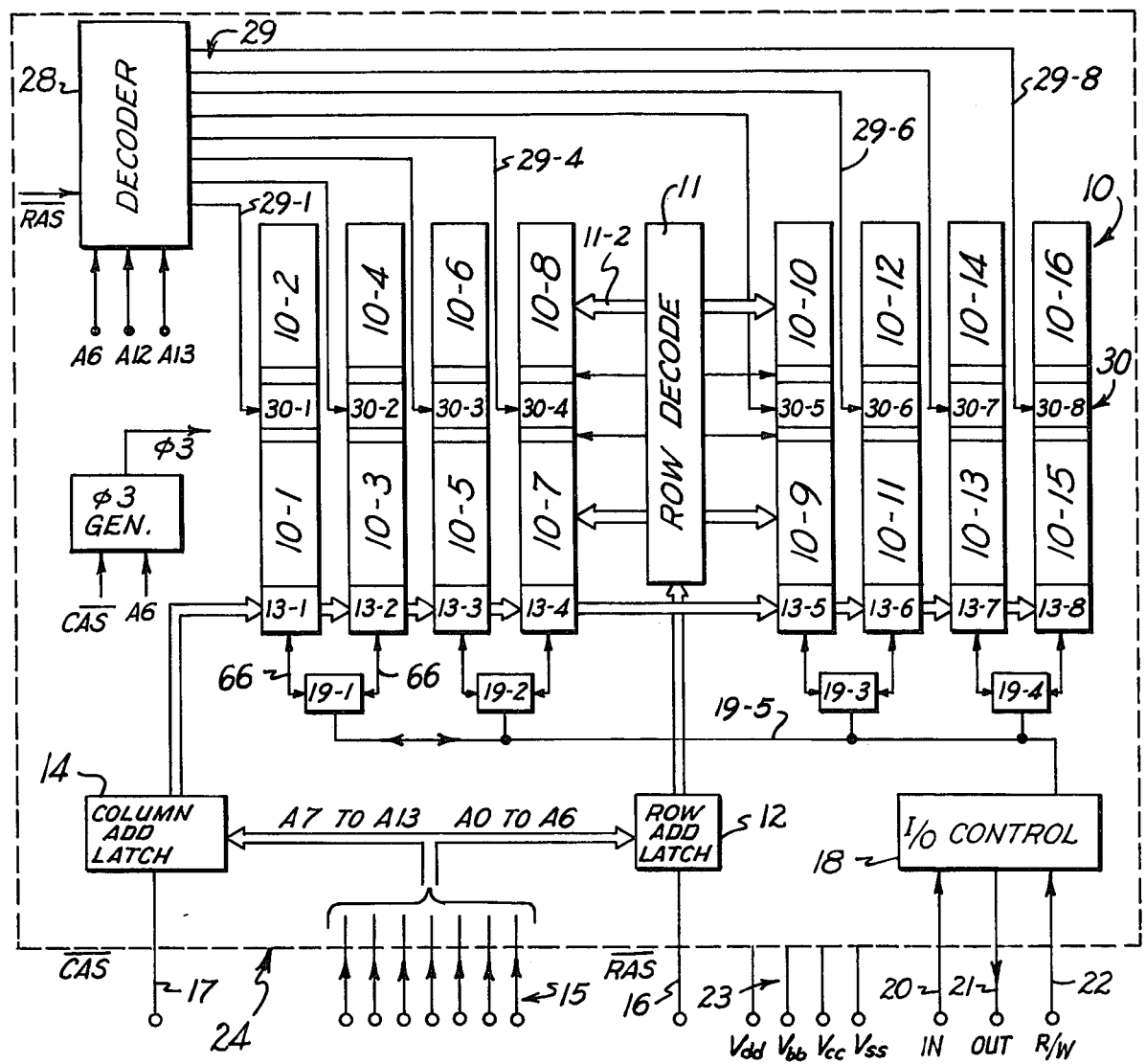
FIG. 1 is a block diagram of a semiconductor memory device which may utilize the invention.
Figure 2:
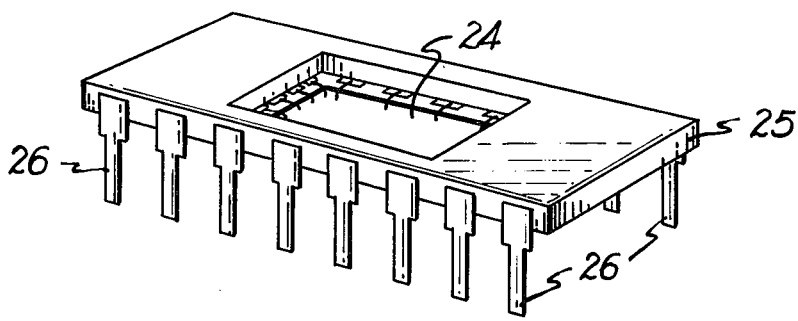
FIG. 2 is a pictorial view of the device of FIG. 1 in a package.

Referring to FIG. 1, an MOS memory device which may use the invention is illustrated. While this device may be of various sizes, the invention was intended for use in a very high density memory containing 16,384 cells on one silicon chip of about one-twentieth square inch, made by the N-channel silicon-gate self-alligned MOS process which has been used for production of 4096 bit memory devices, as set forth in *Electronics*, Sept. 13, 1973, mentioned above. The device consists of an array 10 of 16,384 memory cells which is generally divided into 128 rows and 128 columns; each cell is a so-called one-transistor cell of the type shown in U.S. Pat. No. 3,940,747 or *Electronics*, Sept. 13, 1973. In this embodiment, the array 10 is partitioned in 16 1K blocks labelled 10-1 through 10-16. Each pair of blocks, 10-1 and 10-2, for example, acts as one sensing unit. A row decoder 11 selects one of the 128 row lines as determined by a row or X address contained in a seven-bit row address buffer 12, and a column decoder 13 selects one of the 128 column lines as determined by a column or Y address contained in a seven-bit column address buffer 14. These addresses are applied to the chip by seven address lines 15, on a time-share basis. An $\overline{RAS}$ or row address strobe input 16 enables the row address buffer 12 to accept a row address, which includes address bits A0 to A6, and in like manner a $\overline{CAS}$ or column address strobe input 17 enables the column address buffer to accept a column address (bits A7 to A13) from the lines 15. Fourteen address bits are needed to uniquely define one bit of 16,384 cells ($2^{14} = 16,384$). Input/Output control circuitry 18 is connected to the array 10 via column decode 13 and intermediate output buffers 19, and functions to apply data to the column lines from a data input pin 20, or to detect data on the column lines and apply it to a data output pin 21, under control of a read/write R/W input 22 as well as under control of various internally generated clock and logic voltages. The device requires several supply or input voltages on pins 23; these include V$bb$, V$cc$ and V$dd$ supply voltages as well as ground or V$ss$. Of course, some circuits are designed to operate on one or two supply voltages rather than three. Typically, V$dd$ = +12v., V$bb$ = −5v. and V$cc$ = +5v. As seen in FIG. 2, the device of FIG. 1 is in the form of a silicon chip 24 mounted in a package 25 which has 16 pins 26 corresponding to the 16 input and output lines mentioned above. Thin gold wires connect bonding pads on the silicon chip 24 to internal terminals for the pins 26. A lid, not shown, would seal the device. The package 25 is about ¾ inch in length, so a large number of these packages can be mounted on a standard sized circuit board. For example, a minicomputer may have an entire 32K or 64K word (16 bits/word) memory on one small circuit board.

In the memory device of FIG. 1, only two of the 1K blocks 10-1 to 10-16 are selected at a given time. This selection is accomplished by a decoder 28 which selects one of the eight lines 29 (29+ to 29−8) dependent upon the address bits A6, A12 and A13.

In accordance with the invention, the memory device of FIG. 1 contains improved sense amplifiers 30 in the center of each column line for the purpose of detecting the low signal created on the column lines when a cell is addressed and converting this low signal to a full logic level.

Figure 3:
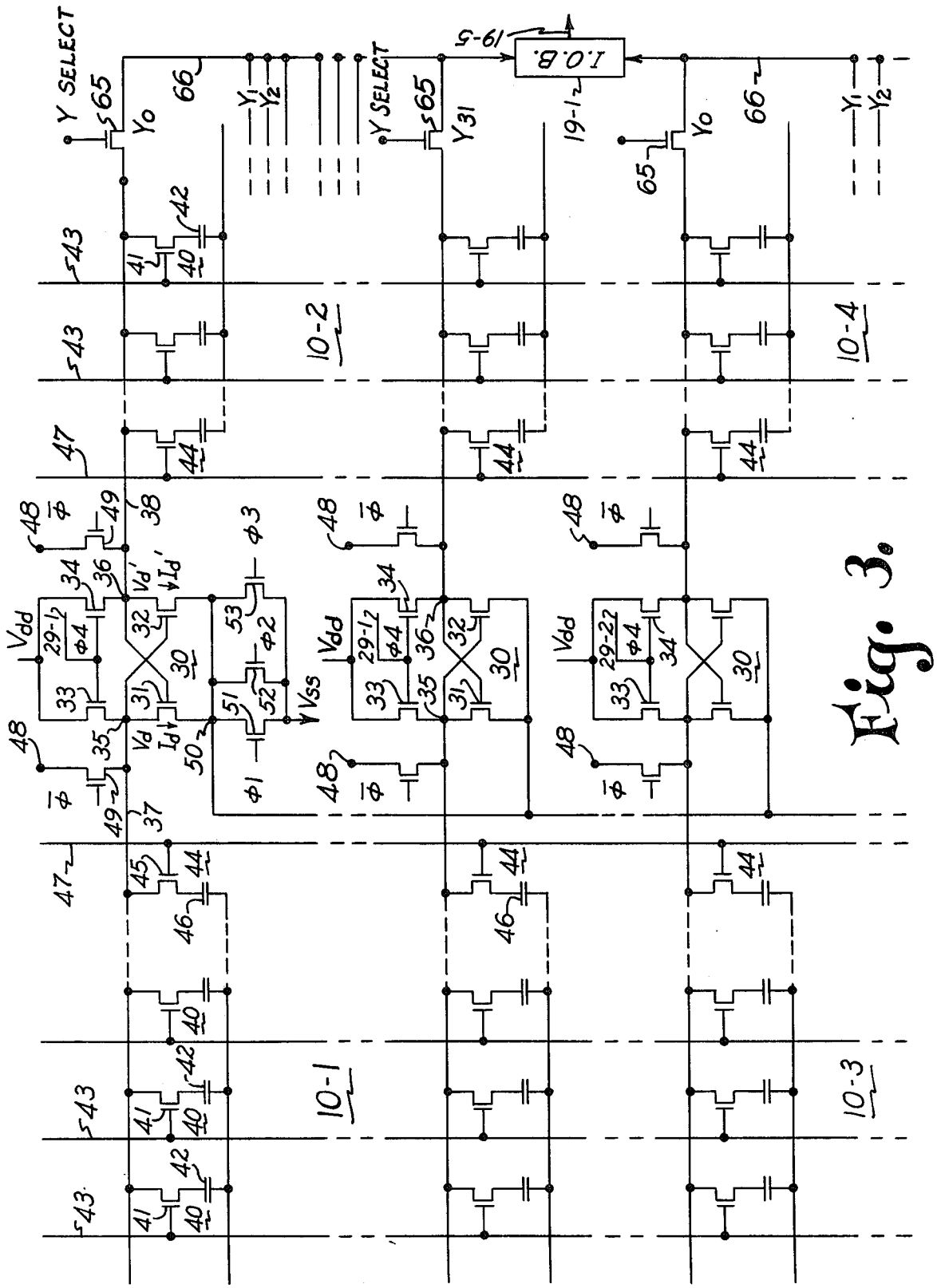
FIG. 3 is an electrical schematic diagram of an array of memory cells for the system of FIG. 1, employing the sense amplifiers of the invention.

Referring to FIG. 3, a sense amplifier 30 according to the invention is illustrated in the array 10. The sense amplifier 30 basically consists of a flip-flop or bistable circuit having two cross-coupled drive transistors 31 and 32 along with associated load transistors 33 and 34.

A pair of nodes 35 and 36 are connected to the respective halves 37 and 38 of the column line. These nodes 35 and 36 are connected to the gates of the opposite transistors 31 and 32 to provide the cross-couple arrangment.

The line 37, half of a column line, has 32 cells 40 connected to it, and so does the line 38. Each cell consists of a transistor 41 and a capacitor 42; the gate of the transistor 41 is controlled by a row line 43 (the row line is also referred to as a word line and an X line), and each row line is connected to 128 gates for transistors 41. In the entire array 10, there are 64 row lines 43, 32 on each side of each sense amplifier, and of course there are 256 sense amplifiers 30, so only a very small part of the array 10 is seen in FIG. 3. Each sense amplifier has two dummy cells 44, one on each side, connected to the column lines 37 and 38. The dummy cells are like the storage cells 40, and include transistor 45 and capacitors 46. Lines 47 function to turn on the transistor 45 in the row of dummy cells on the opposite side of the sense amplifier from the selected cell 40 as defined by bit A5 of the row address, at the same time the selected storage cell 40 is addressed. The column lines 37 and 38 are connected to a reference voltage line 48 through transistor 49, with the gates of these transistors being driven by $\overline{\phi}$; this functions to charge the lines 37 and 38 equally to a voltage level selected to be about (V$dd$ − 2V$t$). The load transistors 33 and 34 are connected to V$dd$ and are controlled by a clock $\phi 4$ which is shown in the timing diagram of FIG. 4. The flip-flop circuit including the transistors 31 and 32 can function when $\phi 4$ goes positive and renders the transistors 33 and 34 conductive, and when a node 50 connected to the drains of the transistors is coupled to ground.

In accordance with the invention, the node 50 is grounded through seperate paths including in this case three transistors 51, 52, and 53 which are controlled by clocks $\phi 1$, $\phi 2$ and $\phi 3$. The transistors 51, 52 and 53 are of different sizes so the amount of current drawn by these transistors from the node 50 to V$ss$ or ground is different, and so the voltage on the node 50 will change depending upon which of the transistors 51, 52 and 53 is on. Transistor 51 is the smallest and transistor 53 is the largest of the three. The advantages of this arrangement will be understood by examining the sensitivity and power dissipation relationships for the sense amplifier of FIG. 3.

When $\phi 4$ goes positive, a sense operation is initiated, and the flip-flop will tend to go toward a stable condition where either transistor 31 is conductive and transistor 32 is cut off, or vice versa. The direction of switching will depend upon the voltage difference on lines 37 and 38 which depends upon whether a one or zero was stored in the selected cell. Since one of the lines 37, 38 will be at a slightly higher voltage than the other, one of the transistors 31, 32 will have a slightly higher voltage on its gate than the other, and thus when $\phi 4$ goes positive one transistor will tend to conduct more current than the other. A figure of merit of the sensitivity S of the sense amplifier of FIG. 3 may be defined in terms of the currents Id and Id' through the transistors 31 and 32 as:

$$S = \frac{(Id - Id')}{Id}$$

which merely says that the greater the difference in currents then the greater the sensitivity of the sense amplifiers. At a given time, $t = t_o$, this may be expanded to:

$$S\Big|_{t=t_o} = \frac{(Id - Id')}{Id}\Big|_{t=t_o} =$$

$$\frac{K(Vd' - Vo - Vt)^2 - K(Vd - Vo - Vt)^2}{K(Vd - Vo - Vt)^2}\Big|_{t=t_o}$$

which is approximately equal to $$\frac{2\Delta V}{(Vd - Vo - Vt)}\Big|_{t=t_o}$$

where
$\Delta V\,|\,t = t_o = Vd - Vd'\,|\,t = t_o$ $K = K'(W/L)$ $Vt$ is the threshold voltage of the transistors 31 and 32
$Vd$ is the drain voltage of the transistors 31 and 32 appearing on the nodes 35 and 36
$Vo$ is the voltage on the node 50
W and L are channel width and length for the transistors 31 and 32 so it can be seen that the sensitivity S is improved as $Vo$ increases, assuming $Vd$ to be fixed.

Figure 5:
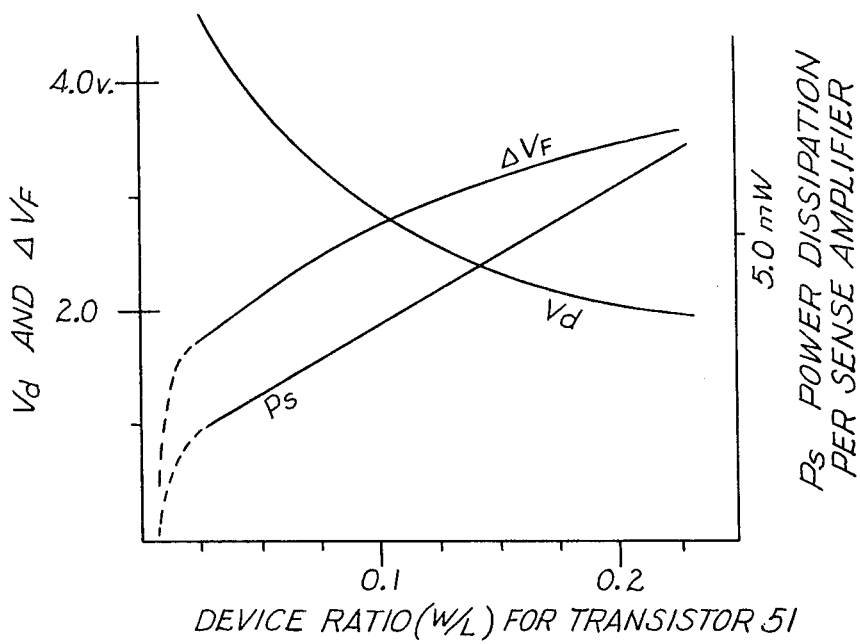
FIG. 5 is a graphic representation of several voltage and power dissipation factors in the circuit of the invention, plotted as a function of device shape.

FIG. 5 shows the manner in which the value of $Vo$ varies as the device ratio W/L of the transistor 51 changes. As expected, the voltage drop across the transistor 51 will be high when its channel width is small compared to length.

If we assume that $Vd - Vt = 5$ volt, the figure of merit S will be improved by 50% when the device ratio of the transistor 51 is reduced from 0.1 to 0.05. In a high density memory design, a 50% increase will be significant because the storage capacitance 42 in the cells 40 can be increased proportionally, resulting in a much higher density chip.

The circuit of FIG. 3 also provides an improvement in speed. Due to a high $Vo$, the precharged voltage on the digit lines 37, 38 or on nodes 35, 36 tends to stay high for 1 level. Contrary to prior sense amplifiers, the sense amplifier of FIG. 3 provides a minimum charging time to the digit lines 37, 38 to refresh a 1 level because the node of the sense amplifier which is to stay at the 1 level does not discharge to a low voltage during the sense operation.

Figure 6:
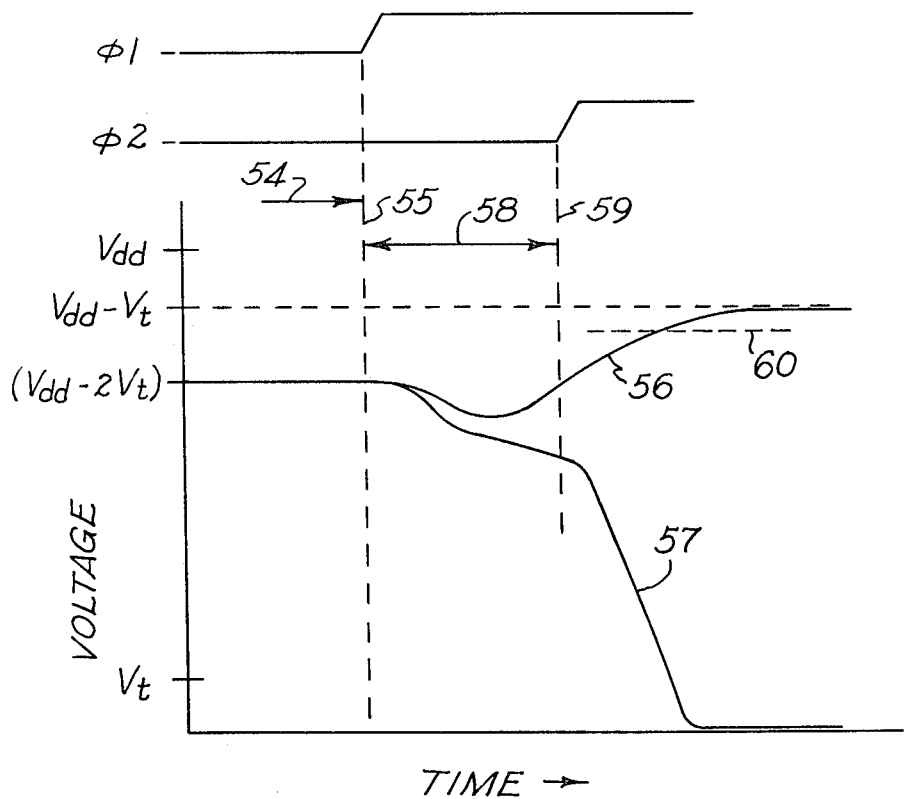
FIG. 6 is a detailed graphic representation of voltage vs. time for the digit lines in the circuit of FIG. 3.

Referring to FIG. 6, the voltage on the digit lines 37, 38 is shown as a function of time as the clocks $\phi1$ and $\phi2$ come on. During the time 54, before $\phi1$ goes high, the voltage on the digit lines 37, 38 is equalized at about $(Vdd - 2Vt)$ as defined by charging from line 48. At time 55, $\phi1$ goes high and one of the lines 37, 38 begins to discharge toward a 0 level while the other discharges only slightly, as seen by the lines 56 and 57. In the time interval 58, prior to the time 59 when $\phi2$ comes on, the node 35 or 36 which is to be at 1 level does not discharge very far below the $(Vdd - 2Vt)$ level, and soon begins to charge back up toward the 1 level through transistor 33 or 34 so long as $\phi4$ is high. The 1 level is about $(Vdd - Vt)$, and there is some level 60 which is an acceptable 1 level at which the chip enable can be cut off. Since the curve 56 does not go very low, it will reach the level 60 very quickly compared to the situation which would occur if the 1 side of the sense amplifier had been allowed to discharge to a lower level as is prior circuits.

With regard to power dissipation, the sense amplifier of FIG. 3 provides improvement because power dissipation Ps per sense amplifier is expressed by $Ps = Vdd \times Id = Vdd \times K'(Vd - Vo - Vt)^2(W/L)$ and again FIG. 5 shows the value of $Ps$ as W/L changes; for low W/L, $Ps$ is low.

Using a small device ratio for the transistor 51 would cause the amplification for the 0 side to be insufficient due to the fact that $Vo$ is high. It is for this reason that the transistor 52 is provided to produce further amplification. The transistor 52 is activated by $\phi2$, later in time than the transistor 51, which (for refresh operation) terminates the conduction of load transistors 33 and 34 by terminating $\phi4$. Thus the digit line 37, 38 which is to go low will have a good 0 level.

During a read or write operation, the transistor 53 is activated by $\phi3$; this transistor is much larger than the transistors 51 and 52. Also, $\phi4$ stays high during the $\phi2$ and $\phi3$ periods for read/write, so the load transistors 33 and 34 stay on. Noise from other circuits appears during read or write operations, so the load transistors need to stay on to ensure reliable operation. Also, for the selected Y line 37, a transfer gate 65 will be rendered conductive, and this line will be connected to a bus 66 going to an input buffer 67 or an output buffer 68 in I/O control 18. This line 66 will represent added capacitance and noise. For these reasons, the high logic level provided by the large transistor 53 is of great advantage.

As discussed above, the array 10 is organized into two 8K arrays as illustrated in FIG. 1, one containing blocks 10-1 to 10-8 and the other containing blocks 10-9 to 10-16. The row decoder 11 is located between the two 8K arrays to minimize the length or RC delay of the polysilicon row-select lines. Each 8K array contains 128 balanced sense amplifiers 30 located in the middle of the array with 32 cells 40 connected to each side of each sense amplifier. In operation, only one 8K array is selected through address A6 and, therefore, only 128 sense amplifiers are active; that is, the decoder 28 produces a $\phi4$ clock signal on only four of the lines 29 during the initial period 70 of FIG. 4b, and so the load transistors 33, 34 are turned on only for sense amplifiers 30 one one side of the row decoder 11. To improve signal sensing for the one-transistor cells, each 8K array is further subdivided into four 2K arrays (10-1 with 10-2, etc.) or pairs of 1K blocks with each pair of blocks containing 32 sense amplifiers 30 and sharing an intermediate output buffer 19 with one other pair of blocks. The intermediate output buffer 19-1 handles the pair 10-1, 10-2 and the pair 10-3, 10-4, for example. Addresses A12 and A13 select one out of four of the 2K arrays in a column decoders 13 for output via the line 19-5 and I/O control 18. The decoders 13 on the left half are duplicates of those on the right half since there are two sets of 128 column lines; the layout is such that this duplication is necessary.

Figure 4:
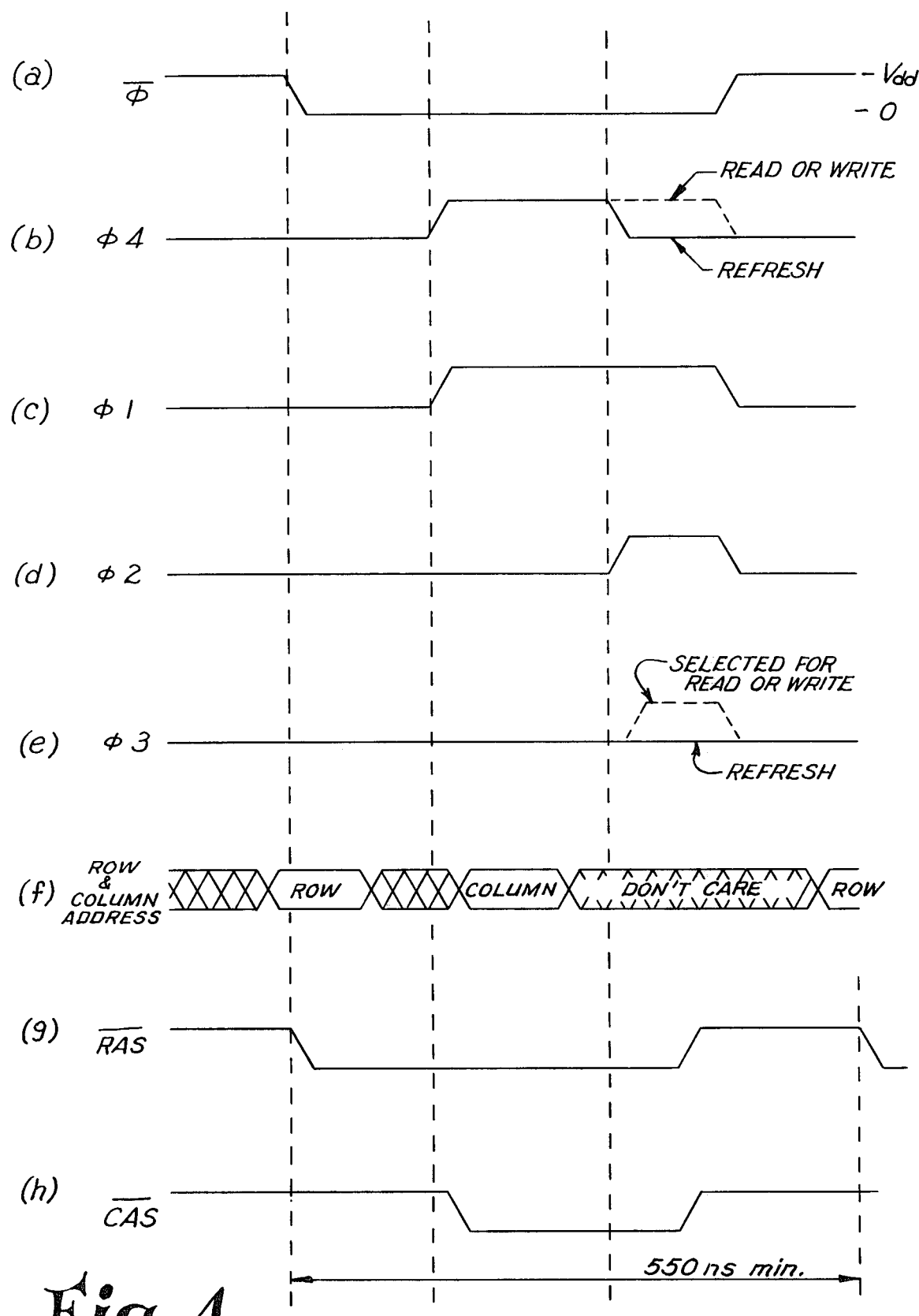
FIG. 4a–4f are graphic representations of voltages appearing at various points in the system of the invention, plotted as a function of time.

At the beginning of a sensing cycle, four of the pairs of blocks 10-1, 10-2, etc., are turned on via clocks $\phi1$ and $\phi4$ of FIG. 4; this refreshes 128 bits, all those on one of the row lines 11-1 for example. Since the transistor 51 is quite small, the power dissipation in this refresh operation is limited to a reasonable amount. The period for this refresh is short as the 1 level digit line voltage 56 does not decrease to a low voltage as seen in FIG. 6. For the refresh cycle, all the $\phi4$'s turn off as seen in FIG. 4b during interval 72 and φ2 goes high as seen in FIG. 4d. In the specific embodiment, $\overline{CAS}$ input from terminal 17. The additional current through transistor 52 during φ2 assures a good 0 level on the digit line 37, 38 within a short time. When the digit line 38 is connected to the large I/O line 66 capacitance, precharged to $Vdd - Vt$, by the Y select gate 65, the 1 voltage level of line 37 would tend to decrease due to the high transient voltage of line 38; this could make a stored 1 voltage poor or totally fail. To avoid this, for the selected block where the selected Y gate 65 for read/write is on, the $\overline{CAS}$ signal generates a φ3 clock which goes high as seen in FIG. 4e. This turns on the large transistor 53, ensuring a good 0 level even though the load transistors 33, 34 are on to maintain a good 1 level.

FIG. 7 is a greatly enlarged photograph of the semiconductor chip 24 containing the system of the invention, showing the partitioning of the array 10 and the location of the row and column decoders and the sense amplifiers. The actual size of the chip is about one-fourth inch by one-sixth inch. The shape and partitioning is partly dictated by the package size as seen in FIG. 2.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising a large number of memory cells in an ordered array of rows and columns partitioned into a plurality of pairs of blocks of cells with pairs of opposing columns in each pair of blocks being separated by one of a plurality of bistable sense amplifiers, each of the sense amplifiers being of the type having a pair of driver transistors and a pair of load transistors, row and column decoders responsive to an address for selecting a cell for reading out or writing in data, and a further decoder responsive to the address for selecting only one of said pairs of blocks and actuating the load transistors of the sense amplifiers thereof during a selected time in a cycle of operation.

2. A memory device according to claim 1 wherein the pairs of blocks are evenly divided on each side of said row decoder.

3. A memory device according to claim 2 wherein the row decoder selects a row on only one side thereof for a given address.

4. A memory device according to claim 3 wherein each sense amplifier has at least two grounding paths for its driver transistors including a first path of low current and a second path of high current, and the second path is actuated only for read and write operations but not for refresh.

5. A memory device according to claim 4 wherein the sense amplifiers on only one side of the row decoder have the first path thereof actuated for a given address.

6. A memory device according to claim 5 wherein the pair of load transistors are rendered conductive during an operating cycle for said selected time by said further decoder for a read or write operation, and are rendered conductive by a clock signal from said further decoder for a refresh operation for all blocks on only one side of the row decoder.

7. A memory device according to claim 6 wherein another grounding path is provided for said driver transistors, and said another path is actuated for all operations but after the first path is actuated.

8. A semiconductor memory system comprising a memory array containing a large number of memory cells, means for addressing the memory array by a multi-bit address, first and second decoders for receiving the address and selecting parts of the array for access, the array being partitioned into two groups of pairs of blocks, the first decoder being between the two groups and selecting one of the groups for actuation for refresh and selecting one line in a group, the second decoder being duplicated and located at an end of each group to select a line in each group, and a third decoder for receiving a part of the address and actuating only one pair of blocks for a given address.

9. A memory system according to claim 8 wherein a sense amplifier is provided for each pair of blocks, located between the two blocks of the pair.

10. A memory system according to claim 9 wherein adjacent pairs of blocks share an intermediate output buffer.

* * * * *